United States Patent
Nistler et al.

(10) Patent No.: US 7,420,372 B2
(45) Date of Patent: Sep. 2, 2008

(54) MAGNETIC RESONANCE DEVICE

(75) Inventors: Jürgen Nistler, Erlangen (DE); Martin Rausch, Spardorf (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/789,235

(22) Filed: Apr. 24, 2007

(65) Prior Publication Data

US 2007/0285095 A1   Dec. 13, 2007

(30) Foreign Application Priority Data

Apr. 26, 2006   (DE) .................. 10 2006 019 421

(51) Int. Cl.
*G01V 3/00*   (2006.01)
(52) U.S. Cl. ...................... 324/318; 324/319
(58) Field of Classification Search ......... 324/300–322; 600/407–422; 335/299, 296
See application file for complete search history.

(56) References Cited

U.S. PATENT DOCUMENTS

| 6,549,010 | B2 | 4/2003 | Roozen et al. |
| 6,552,543 | B1 | 4/2003 | Dietz |
| 6,683,458 | B2 * | 1/2004 | Dewdney .................. 324/318 |
| 6,831,461 | B2 * | 12/2004 | Arz et al. .................. 324/318 |
| 6,894,498 | B2 | 5/2005 | Edelstein |

FOREIGN PATENT DOCUMENTS

| DE | 199 40 551 C1 | 5/2001 |
| WO | WO 2004/009924 A1 | 1/2004 |
| WO | WO 2004/098870 A1 | 11/2004 |

* cited by examiner

*Primary Examiner*—Brij B Shrivastav

(57) ABSTRACT

There is described a magnetic resonance device incorporating at least one first component part, which when the magnetic resonance device is operating oscillates, attached by at least one local load-bearing joint to at least one second oscillation-sensitive component part of the magnetic resonance device, where the joint has at least one actuatable facility for generating counter-oscillations which damp an oscillation of the first component part, where the second component part is a cladding element, in particular a vacuum cladding, which is affixed to the magnet via the joint, whereby a gap between the cladding element and the magnet is evacuatable, and the gap is provided with a pressure-isolating acoustically soft seal, in particular in the form of bellows.

17 Claims, 2 Drawing Sheets

MAGNETIC RESONANCE DEVICE

CROSS REFERENCE TO RELATED APPLICATIONS

This application claims priority of German application No. 10 2006 019 421.7 DE filed Apr. 26, 2006, which is incorporated by reference herein in its entirety.

FIELD OF INVENTION

The invention relates to a magnetic resonance device incorporating at least one first component part, which when the magnetic resonance device is operating oscillates, attached by at least one local load-bearing joint to at least one second oscillation-sensitive component part of the magnetic resonance device, where the joint has at least one actuatable facility for generating counter-oscillations which damp the oscillation of the first component part.

BACKGROUND OF INVENTION

Modern magnetic resonance devices have several component parts which generate oscillations, particularly in the audible range. The most obvious examples of this which can be cited are the gradient coils and the coldhead. These oscillations are transmitted via acoustically hard joints between the individual component parts in a magnetic resonance device, ultimately in particular also to the cladding, so that a patient positioned in the patient receiver opening can be exposed to a high noise level.

The methods used for reducing this noise in the case of magnetic resonance devices include so-called vacuum claddings, with which the magnet, a term which in the context of this invention is to be understood as the casing which surrounds at least the superconducting elements, is encapsulated in a cladding, with the space between the cladding and the magnet being evacuated. By this means, the transmission path for structure-borne sound, between the vibrating parts of the device such as for example the gradient coils affixed to the magnets and the cladding, is cut off thus reducing the noise emitted to the patient. Nevertheless, the noise emission is not reduced completely by such a vacuum cladding, because the major factor which is then still relevant in determining the noise transmission is the attachment of the cladding. The vibrations of the oscillating magnets can propagate via the attachment points along the cladding, as a result of which high noise emissions can occur in the region of the patient opening.

In order to get round these problems of the transmission path for structure-borne sound with a vacuum cladding of this type, it has been proposed that use be made of a so-called composite material for the vacuum cladding. Such a composite material consists of GRP layers to increase the rigidity and fiber damping materials to increase the acoustic damping. It is a disadvantage that the manufacturing costs for such a cladding are extremely high due to the expensive method of manufacture, and that the rigidity of the cladding is reduced by the damping layers, which can result in mechanical deformations due to the high vacuum forces.

It has also been proposed that a reduction in the sound transmission be achieved by a suitable choice of the attachment point for the cladding, at a point on the magnet where the vibrations are as low as possible. However, such low-vibration points can only be found for a few discrete frequencies. But the oscillations which arise from the component parts which generate oscillations lie across a wide spectrum of frequencies.

Finally, it is also known that the joint of the vacuum cladding to the magnet is effected by an acoustically hard seal, which in turn permits a relevant structure-borne sound transmission.

U.S. Pat. No. 6,549,010 B2 describes a magnetic resonance device with which vibrations of the gradient coils relative to the cryostatic shell of the magnet can be damped by an attachment which is fitted with active damping elements. Another variant of an actively damped joint between the cryostatic shell and the gradient coils is described by U.S. Pat. No. 6,894,498 B2, which describes a support with a flexible damping element and an active one, in which the gradient coils are practically suspended.

DE 199 40 551 C1 describes a magnetic resonance device in which the gradient coils are arranged on an external cladding of the magnet, where they can be damped by active oscillation-damping elements. Alternatively, a coldhead can also be arranged on the external cladding, and be damped.

SUMMARY OF INVENTION

An object underlying the present invention is therefore to produce a magnetic resonance device for which the noise emission is further reduced.

For the purpose of solving this problem, in accordance with the invention provision is made with an apparatus of the type mentioned in the introduction for the second component part to be a cladding element, in particular a vacuum cladding, which is affixed on the magnet via the joint, whereby a gap between the cladding element and the magnet is capable of being evacuated and the gap is provided with an acoustically soft pressure-isolating seal, in particular in the form of bellows.

Here, the invention is based on the recognition that by themselves the passive damping measures mentioned in the introductory description cannot achieve at the same time the load bearing effect of the local joints and an adequate decoupling of the structure-borne sound. For this reason, it is proposed to provide as the element comprising the joint, or as part of the joint, one or more actuatable facilities for generating counter oscillations which damp the oscillations of the second component part. So the magnetic resonance device in accordance with the invention is provided with an actuatable active damping of the oscillations. The facility for generating the damping counter-oscillations thus ultimately generates a counter-oscillation which has a phase displaced by 180° from the oscillations of the second component part, so that the two oscillations at least approximately cancel each other out, thereby reducing the sound emission.

Here, one possibility is to realize the joint via the facility, that is to say the facility itself bridges a gap between the first and the second component parts, and there it functions as a load-bearing part and directly as an active damper. However, the facility can also be a part of the joint if the actual joint is realized by more or less acoustically soft substances. So provision can be made for the joint to be provided in addition by an acoustically soft noise-damping material, so that the joint also subsequently includes the acoustically soft passive noise damping material.

By an active damping of the oscillations, the facility thus advantageously permits improved noise reduction to be achieved by preventing resonance in the second component part, because the actuation capability is damped by a counter-oscillation exactly the oscillation which is actually present. On the other hand however, a rigid and load-bearing joint is provided, which also satisfies the mechanical requirements. Until now, it has always been necessary to follow a middle path between the damping properties of a passive damping material and mechanical stability, which resulted in compromises against both criteria. In addition, active damping of this type proves to be cost-effectively realizable.

Here, the second component part is a cladding element, in particular a vacuum cladding. The cladding elements are those component parts of the magnetic resonance device on its external sides, which are accordingly primarily responsible for noise emission to the outside and must therefore be kept quiet. The invention can be applied with particular advantage to vacuum claddings. With these; provision is then made for a gap between the cladding element, that is the vacuum cladding, and the magnet to be evacuatable, and this gap is provided with an acoustically soft pressure-isolating seal, in particular in the form of bellows. The cladding is then affixed in two ways to the magnet, that is to the casing surrounding the elements which actually produce the magnetic field, including for example the superconducting coils. On the one hand there is an acoustically soft but not load-bearing seal on the gap between the cladding and the magnet. On the other hand, a local load-bearing joint is provided at several discrete points, whereby each of the joints has an actuatable facility for generating counter-oscillations which damp any oscillation of the vacuum cladding. Overall therefore it is advantageous that three measures which complement each other are provided for damping noise or oscillations, as applicable: the vacuum, the acoustically soft seal, in particular in the form of bellows, and the active generation of counter-oscillations on the load-bearing joint All the transmission paths for structure-borne sound are thus advantageously damped. Here, the local load-bearing joints also absorb the pressure forces which arise from the vacuum, so that they then do not load the bellows, which can be designed to be correspondingly more acoustically soft. Here, just a few load-bearing joints are ultimately sufficient in general. In the case of a cylindrical magnetic resonance device for example, provision can be made for fitting at least three joints on each face of the magnetic resonance device. In particular, four load-bearing joints have proved to be sufficient and optimal.

Even a receiving and/or transmitting coil is generally only attached at a few local load-bearing joints. It can thus form the second component part in the sense of the present invention. It is thus also advantageously possible to damp vibrations from receiving or transmitting coils affixed to the magnetic resonance device. Such coils may be permanently installed or moveable whole-body coils, but can also be permanently installed or moveable local coils.

A further source of oscillations in a magnetic resonance device is the coldhead, which can form a first component part in the sense of the present invention. Here, the oscillations of the coldhead are generated by the coldhead itself. Normally, the coldhead is affixed to the magnet by bolts, which form local load-bearing joints. These bolts too can, in accordance with the invention, be replaced by joints with at least one actuatable facility for generating a counter-oscillation to damp oscillations of the second component part.

It is, of course, possible to realize all these active noise damping measures on a single magnetic resonance device. So it is possible to conceive of a magnetic resonance device which has a vacuum cladding affixed at several discrete points by local load-bearing joints which have a facility, transmission and/or receiving coil which is also affixed by load-bearing joints with a facility, and include a coldhead which is again actively damped by means of the apparatuses.

The noise-generating oscillations under discussion lie in the range up to a few kHz, in particular in the range from 100 to 2500 Hertz, so that it is preferable that oscillations in this range can also be damped.

The oscillations of the first component part often do not arise solely in a single direction in space. For this reason, the joint can advantageously incorporate several, in particular three, separately drivable facilities with which counter-oscillations can be generated in various directions in space. In such a form of embodiment, it is possible to damp active oscillations not merely in one direction in space, but because of the separate actuation of the facility it is possible to damp oscillations in all directions in space.

It is expedient if at least one sensing device is provided on or in the region of the joint for measuring the oscillation of the first or the second component part, and if the facility can be actuated as a function of the results of the sensing. The sensing device measures the strength and, if necessary, the direction of the oscillations of the first or second component part as applicable, and the facilities are actuated by reference to the result of the measurement. Here, the sensing device can be provided either on hem second component part or equally on the first component part, but it should be arranged near to the joint so that a direct relationship between the oscillation at the site of the sensing device and the oscillation at the site of the joint can be recognized. In a particularly advantageous embodiment, the or a sensing device can be integrated into the facility, in particular the facility can be operated both in a sensing mode and also in a counter-oscillatory mode. In this way, the oscillations are measured by the facility itself. It is therefore particularly simple to generate an appropriate counter-oscillation, because the exact oscillation at the site of the facility is known. A facility of this type, which can be operated as a sensor, can also be used expediently and advantageously with a magnetic resonance device of the type mentioned in the introduction, irrespective of the specific form of embodiment of the invention, that is irrespective of the three mutually-complementary damping measures on the cladding element.

For the purpose of actuating the facility, two main ways of actuation are conceivable. Here, a distinction is made between the "feedback" method and the "look ahead" method Here, both methods can advantageously make use of the sensing device.

Here, the use of the "feedback" method corresponds essentially to a closed loop control circuit. For this, it is possible to provide for the actuation of the facility to be effected directly on the basis of the current result of the measurement by the sensing device. The strength ard, if necessary, the direction of the oscillations of the first or second component part, as applicable, are measured and by reference to the results of the measurement the facilities are directly actuated so that the oscillation of the second component part is always minimal. If the facility itself is the sensing device, then the facility itself measures the oscillations, if necessary at regular short intervals of time, and then generates an appropriate counter-oscillation.

As an alternative to a "feedback" actuation, or a user-selectable one, it is also possible to provide for "look-ahead" actuation of the facility, based on at least one operating parameter of the magnetic resonance device, to which end it is expedient to provide a control unit. Here, the assumption is made that under the same or similar operating conditions, as applicable, the same oscillations or sequences of oscillations, as applicable, are to be observed. The oscillations caused by the gradient coils, for example, derive ultimately from Lorentz forces which are dependent on their current supply.

When the operating current is the same, or the operating current cycle is the same, then respectively the same oscillations or oscillation cycles are produced. For this reason, provision is made in accordance with the invention for a calibration phase, in which the various operating parameters used are adjusted or recorded, as applicable, and to this end the oscillations which have arisen are sensed or recorded, as applicable, at a location close to the facilities or by the facilities themselves if they are constructed as sensors. In subsequent operation, the control unit records the operating parameter and actuates the facility to generate the appropriate counter-oscillations. In the case of magnetic resonance devices, certain pulse sequences are also often used. Here it would be possible, for example, to detect only the next sequence used, for example as input by a user, and to effect the actuation solely on the basis of the distinctive oscillatory behavior for his sequence. In this form of embodiment it would then not even be necessary to undertake continuous recording of the opening parameters. Particularly advantageously, such a calibration phase can be carried out with a facility which can be toggled between a sensing mode and a counter-oscillation mode. However, it is also possible to conceive of using an external sensing device which, for the measuring of the calibration measurement, is placed in a position close to the joint. As an alternative to such a calibration phase it is also possible to determine the oscillatory behavior of the second component part on the joint, for example by a simulation, and to carry out the "look-ahead" control by reference to such a calculated result.

The actuation can also, of course, be effected on the basis of several operating parameters. Apart from the gradient coil current already mentioned, the operation or current supply to the coldhead can also or alternatively be called on as an operating parameter in actuating the facilities for generating the counter-oscillation.

Several embodiments can be considered for the facility for generating the counter-oscillations. However, it has proven to be particularly advantageous to use piezo-elements or a stack of piezo-elements. Depending on their actuation, piezo-elements change their shape so that when they have a fixed joint to a rigid part it is possible to apply a force to this rigid part. If the current supply can be modulated appropriately then a corresponding oscillation is generated in the rigid part. This effect can be exploited in the present invention by the use of such piezo-elements or stacks of piezo-elements. Stacks of piezo-elements amplify the maximum force which can be applied for generating the counter-oscillations, so that better damping can be achieved. In addition, piezo-elements have the advantage that they have short response times and are insensitive to the magnetic fields present throughout the magnets.

Alternatively, provision could also be made for a hydraulic or pneumatic device, in particular a piston oscillator or an electro-magnetic or magnetostriction element, to be used as the facility. In particular in the case of electro-magnetic or magnetostriction elements care should be taken that they are placed at locations where the magnetic fields which are present there cannot significantly impair their operation.

In closing, it should also be mentioned that the present invention does not, of course, exclude the possibility of adding other damping measures. Apart from the acoustically soft materials for the joints, already mentioned, it would for example also be possible to use in addition for the second component part the composite material mentioned, if yet further noise damping is required or desired.

BRIEF DESCRIPTION OF THE DRAWINGS

Further advantages and details of the present invention will be seen from the exemplary embodiments, described below and by reference to the drawings. These show.

DETAILED DESCRIPTION OF INVENTION

Figure 1:
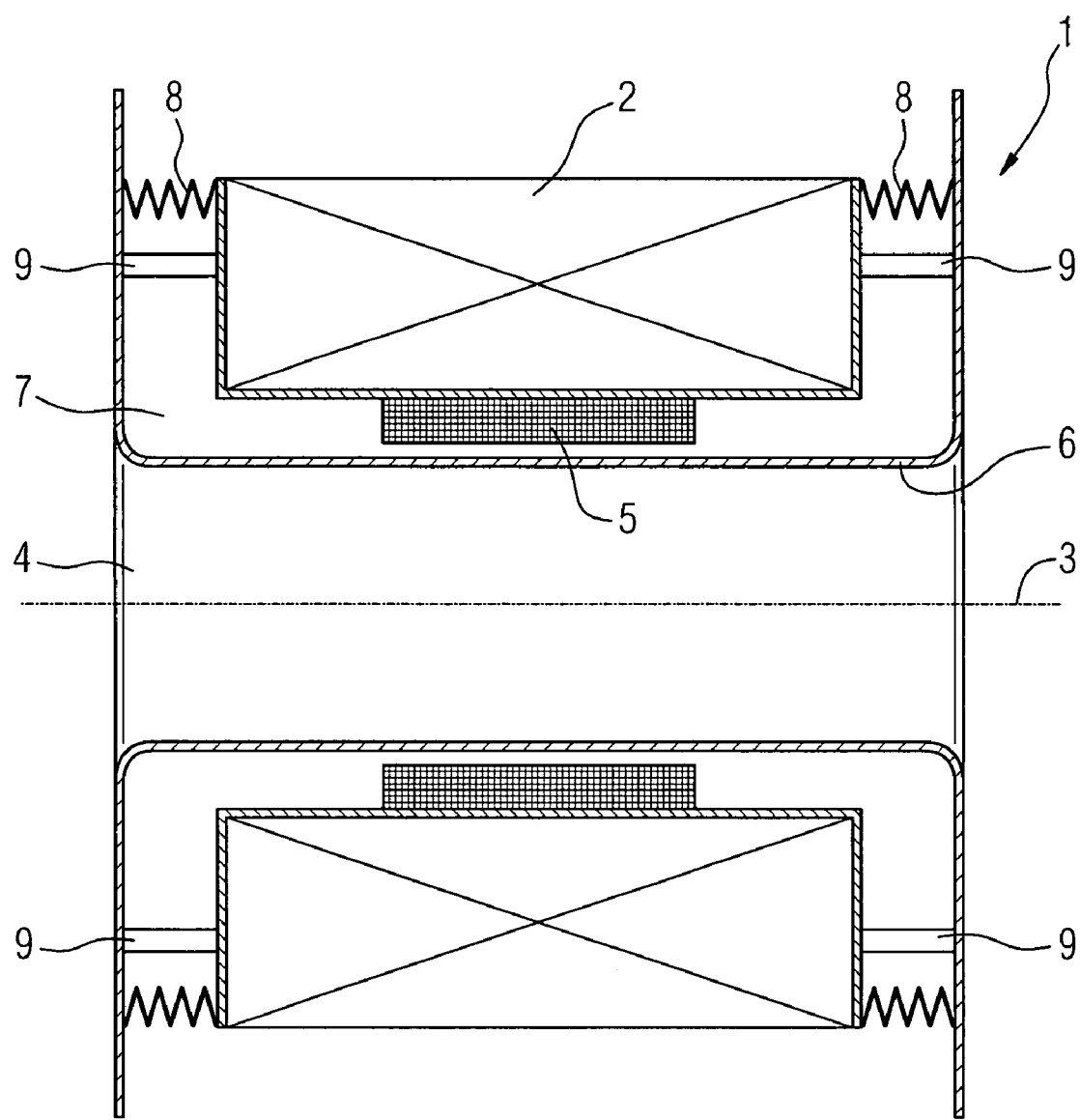
FIG. 1 diagrammatic sketch of a longitudinal section through a magnetic resonance device in accordance with the invention.

FIG. 1 shows a longitudinal section through a magnetic resonance device 1 in accordance with the invention. The superconducting coils and other facilities together with their casing form the magnet 2. This is constructed as a cylindrical shape, with the patient being introduced along the central axis 3 into a patient opening 4.

Arranged immediately inside the magnet are the gradient coils 5. The magnet is further surrounded by a vacuum cladding 6, which means that the gap 7 between the vacuum cladding 6 and the magnet 2 is evacuate. This is possible because a seal is formed on its rim by bellows 8. The bellows 8 are not by themselves capable of withstanding the pressure created by the vacuum in the gap 7, 80 that on the ends of the magnet four local load-bearing joints 9 are provided on each end, where in this diagrammatic sketch showing a section through the magnetic resonance device only two joints 9 can be seen in each case, that is four joints 9 in total.

Due to the Lorentz forces the gradient coils 5, for example, generate vibrations or oscillations, as applicable, which are liable to propagate via the magnet 2 as far as the cladding 6, where it is possible for noise to develop. For this reason, several noise damping measures are provided with the magnetic resonance device in accordance with the invention. First there is the vacuum in the gap 7, which blocks the air transmission path. The seal is effected by the acoustically soft bellows 8, via which there is practically no possibility of structure-borne sound transmission. In addition, the joints 9 are now constructed in such a way that it is possible actively to counter any structure-borne sound transmission. To this end, each joint 9 has a facility for generating a counter-oscillation which damps any oscillation of the vacuum cladding 6. There are various possibilities for realizing this, of which two are shown in FIGS. 2 and 3.

Figure 2:
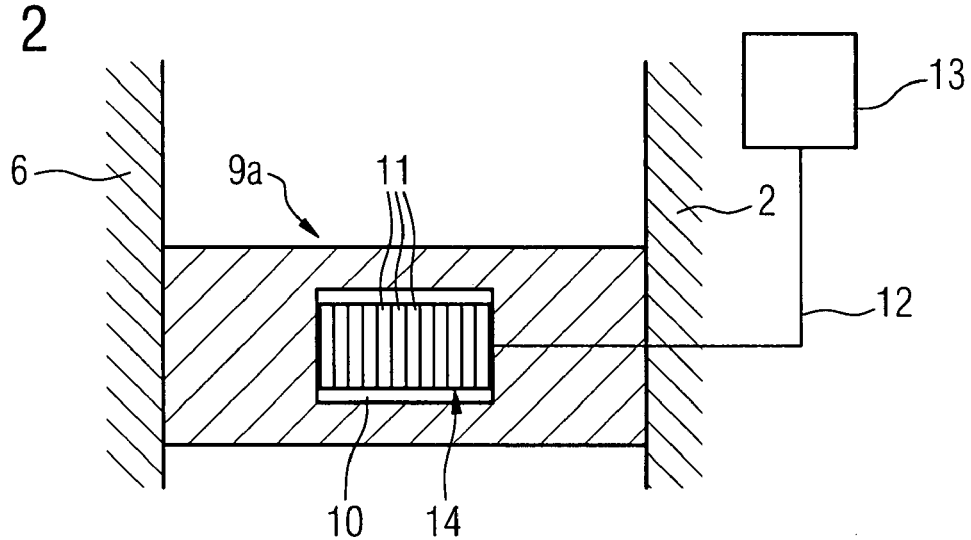
FIG. 2 a joint in accordance with a first form of embodiment.

FIG. 2 shows a first form of embodiment of a joint 9a between the magnet 2 and the vacuum cladding 6. Into a cavity 10 in the joint 9a are introduced several stacked piezo-elements 11 which can be actuated via wiring 12. The actuation is effected through a control unit 13, shown only in schematic form. The facility 14 formed by the stacked piezo elements 11 can be operated both in a sensing mode and also in an oscillation generating mode. During a calibration phase, the facility 14 is operated in its sensing mode. In doing this, various operating parameters are set and the resulting oscillations are measured. The data obtained is stored in the control unit 13. During the subsequent operation of the magnetic resonance device, "look-ahead" control is realized by the controller 13. In doing so the control unit 13 captures the appropriate operating parameters, for example the gradient coil current, and actuates the facility 14 which is now operating in counter-oscillation mode, or the individual piezo-elements 11, as applicable, in such a way that exactly the oscillation generated with these operating parameters is actively countered. To this end, the facility 14 generates a counter-oscillation, which is shifted by 180°.

Although here, for the sake of clarity, only a single facility 14 is shown, it is advantageous to provide several facilities, in particular three mutually perpendicular ones, so that counter-oscillations can be generated in all directions in space. By this means, optimal active damping of the vacuum cladding 6 is realized.

Figure 3:
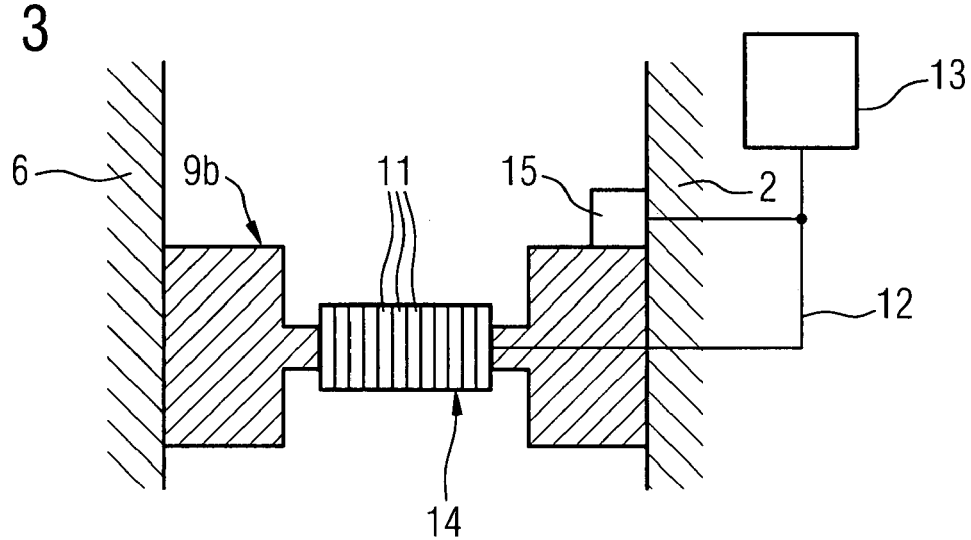
FIG. 3 a joint in accordance with a second form of embodiment.

FIG. 3 shows a further form of embodiment of a joint 9b between the vacuum cladding 6 and the magnet 2. In this case, the joint is here realized directly by the facility 14. This consists in turn of several stacked piezo-elements 11, and once again only one facility is shown, it again being entirely possible to provide several facilities for generating counter-oscillations in various directions in space. Here, the facility 14 cannot be operated in a sensing mode and a counter-oscillation mode, although this would also be possible. A sensing device 15 is installed in addition, directly adjacent to the joint 9b. This sensing device 15 can of course also be installed on or in the joint 9b itself or on the vacuum cladding 6. The only important thing here is that it should be close to the joint 9b. The facility 14 can now be operated directly by the sensor 15 by means of feedback actuation, or it is possible to provide in turn a control unit 13 which first processes the data from the sensing device 15, and can additionally or alternatively, as applicable, be designed for making calibration measurements for look-ahead control. If necessary, a user can also select the operating mode in which the facility 14 is to be actuated.

Although here only stacks of piezo-elements have been shown as the facilities, other ways of generating the counter-oscillations are conceivable. Thus, it would also be possible to provide a hydraulic or pneumatic facility, in particular a piston oscillator, or an electro-magnetic or magnetostriction element.

Figure 4:
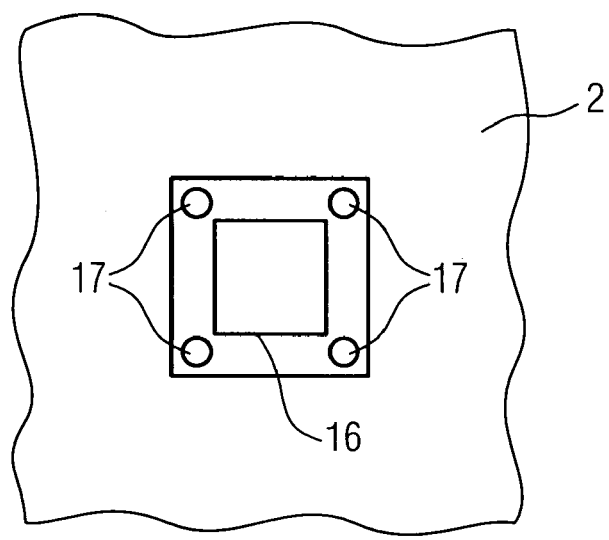
FIG. 4 the attachment of a coldhead to the magnetic resonance device in accordance with the invention.

FIG. 4 shows a section of the surface of the magnet 2, on which is affixed a coldhead 16. Here, the attachment is effected by means of four facilities 17, each of which also has an actuatable facility for generating counter-oscillations to damp any oscillation of the magnet. These can be constructed in a similar way to the joints 9a and 9b. For actuation on the basis of an operating parameter it is expedient here to use the operation or operating current, as appropriate, of the coldhead 16. In this way it is possible to prevent the oscillations, which arise naturally in the coldhead 16, from propagating to the magnet 2 and other component parts, for example the cladding.

The invention claimed is:

1. A magnetic resonance device, comprising:
   a component part oscillating during operation of the magnetic resonance device;
   a oscillation-sensitive cladding element;
   a load-bearing joint via the component part attached to the cladding element, wherein a gap between the cladding element and the component part is evacuated; and
   a device for generating counter-oscillations to damp an oscillation of the component part.

2. The magnetic resonance device as claimed in claim 1, wherein the gap is provided with a pressure-isolating acoustically soft seal.

3. The magnetic resonance device as claimed in claim 2, wherein in the soft seat forms a bellow.

4. The magnetic resonance device as claimed in claim 2, wherein the component part comprises a magnet.

5. The magnetic resonance device as claimed in claim 4, wherein the load-bearing joint comprises the device for generating counter-oscillations.

6. The magnetic resonance device as claimed in claim 5, wherein the cladding element is a vacuum cladding.

7. The magnetic resonance device as claimed in claim 6, wherein oscillations in a range from 100 to 2500 Hertz are damped.

8. The magnetic resonance device as claimed in claim 6, wherein the load-bearing joint comprises at least two devices for generating counter-oscillations to generate counter-oscillations in different directions in space.

9. The magnetic resonance device as claimed in claim 1, further comprising a sensing device at least in a region of the load-bearing joint, to measure the oscillation of at least the component part or the cladding element, wherein the device for generating counter-oscillations is actuated based upon results of the sensing.

10. The magnetic resonance device as claimed in claim 9, wherein the load-bearing device comprises the sensing device.

11. The magnetic resonance device as claimed in claim 9, wherein the sensing device is integrated into the device for generating counter-oscillations.

12. The magnetic resonance device as claimed in claim 11, wherein device for generating counter-oscillations is operated in a sensing mode or in a counter-oscillation mode.

13. The magnetic resonance device as claimed in claim 9, wherein the device for generating counter-oscillations is actuated directly based upon actual sensing results from the sensing device.

14. The magnetic resonance device as claimed in claim 1, wherein a look-ahead actuation for the device for generating counter-oscillations is based upon a operating parameter of the magnetic resonance device and provided by a control unit.

15. The magnetic resonance device as claimed in claim 14, wherein the operating parameter is based upon a gradient coil current.

16. The magnetic resonance device as chimed in claim 1, wherein the device for generating counter-oscillations is a piezo-element or a stack of piezo-elements.

17. Magnetic resonance device as claimed in claim 1, wherein the device for generating counter-oscillations is a hydraulic or pneumatic facility.

* * * * *